(12) United States Patent
Park et al.

(10) Patent No.: US 12,328,134 B2
(45) Date of Patent: Jun. 10, 2025

(54) RECEIVER, INTERFACE CIRCUIT INCLUDING THE SAME, AND METHOD OF OPERATING RECEIVER

(71) Applicant: SAMSUNG ELECTRONICS CO., LTD., Suwon-si (KR)

(72) Inventors: Dasom Park, Suwon-si (KR); Donghyuk Lim, Suwon-si (KR); Youngho Choi, Suwon-si (KR); Kyeongjoon Ko, Suwon-si (KR); Byoungjoo Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 18/375,827

(22) Filed: Oct. 2, 2023

(65) Prior Publication Data
US 2024/0223233 A1    Jul. 4, 2024

(30) Foreign Application Priority Data
Jan. 3, 2023  (KR) .................... 10-2023-0000902

(51) Int. Cl.
*H04B 1/16* (2006.01)
*H03F 3/19* (2006.01)
*H03K 3/037* (2006.01)
*H03K 5/24* (2006.01)

(52) U.S. Cl.
CPC ................ *H04B 1/16* (2013.01); *H03F 3/19* (2013.01); *H03K 3/037* (2013.01); *H03K 5/24* (2013.01)

(58) Field of Classification Search
CPC .......... H04L 2025/03764; H04L 25/14; H04L 25/068; H04L 25/0202; H03M 1/12; G06F 13/4282
See application file for complete search history.

(56) References Cited

U.S. PATENT DOCUMENTS

| 8,353,764 | B2 | 1/2013 | Tan et al. |
| 8,885,735 | B2 | 11/2014 | Schoenborn |
| 9,213,667 | B2 | 12/2015 | Cranford, Jr. et al. |
| 9,515,675 | B2 | 12/2016 | Bae et al. |
| 9,804,987 | B2 | 10/2017 | Choi et al. |

(Continued)

OTHER PUBLICATIONS

Timothy Prickett Morgan, "The system bottleneck shifts to PCI-Express", The Next Platform, Jul. 14, 2017 (Year: 2017).*

(Continued)

*Primary Examiner* — Aristocratis Fotakis
(74) *Attorney, Agent, or Firm* — Sughrue Mion, PLLC

(57) ABSTRACT

A receiver is provided. The receives includes: a signal detection circuit configured to receive differential signals having a variable data rate, and provide a detection signal based on the differential signals corresponding to a first data pattern of a first frequency, wherein the first data pattern of the first frequency indicates an exit from an electrical idle state; an analog-digital converter circuit configured to generate sample data by sampling the differential signals at a second frequency, and identify whether the sample data corresponds to a second data pattern which indicates normal data; and a control circuit configured to enable the analog-digital converter circuit based on the detection signal, and store the sample data. The first frequency is lower than the second frequency.

20 Claims, 13 Drawing Sheets

(56) References Cited

U.S. PATENT DOCUMENTS

| | | |
|---|---|---|
| 9,916,266 B2 | 3/2018 | Iyer et al. |
| 2006/0215794 A1 | 9/2006 | Murugan et al. |
| 2015/0282068 A1* | 10/2015 | Rajagopal ........... H04L 27/2692 370/350 |
| 2015/0370315 A1 | 12/2015 | Unnikrishnan et al. |
| 2019/0296944 A1* | 9/2019 | Shiraishi ........... H04L 25/03057 |
| 2020/0145341 A1* | 5/2020 | Das Sharma ........... H04L 12/12 |
| 2021/0297295 A1* | 9/2021 | Fujii .................... G11C 7/1084 |

OTHER PUBLICATIONS

Extended European Search Report dated May 7, 2024, issued by the European Patent Office in European Application No. 23214461.8.

\* cited by examiner

RECEIVER, INTERFACE CIRCUIT INCLUDING THE SAME, AND METHOD OF OPERATING RECEIVER

CROSS-REFERENCE TO RELATED APPLICATION

This application is based on and claims priority to Korean Patent Application No. 10-2023-0000902, filed on Jan. 3, 2023, in the Korean Intellectual Property Office, the disclosure of which is incorporated by reference herein in its entirety.

BACKGROUND

The present disclosure relates to a receiver, and more particularly, to a receiver for performing an operation of exiting from an electrical idle state.

Various standards may be applied to support connections between a computer mainboard and peripheral devices.

Peripheral component interconnect express (PCIe) is a serial interconnect standard applied to some computer systems. PCIe provides a point-to-point topology that enables an exclusive connection between devices in a computer system. An exclusive connection between two devices may be referred to as a link. A link may include a maximum of 32 lanes, one lane may include two differential pair signals, and each differential pair signal may carry data in one direction.

PCIe devices may transition to an electrical idle state to reduce power consumption. A transmission device may exit from an electrical idle state and transmit pre-defined data, and a reception device may exit from the electrical idle state when the pre-defined data is received.

SUMMARY

One or more example embodiments provide a receiver for disabling a signal detection circuit when exiting from an electrical idle state to save power consumed by the signal detection circuit configured to monitor pre-defined data.

According to an aspect of an example embodiment, a receiver includes: a signal detection circuit configured to receive differential signals having a variable data rate, and provide a detection signal based on the differential signals corresponding to a first data pattern of a first frequency, wherein the first data pattern of the first frequency indicates an exit from an electrical idle state; an analog-digital converter circuit configured to generate sample data by sampling the differential signals at a second frequency, and identify whether the sample data corresponds to a second data pattern which indicates normal data; and a control circuit configured to enable the analog-digital converter circuit based on the detection signal, and store the sample data. The first frequency is lower than the second frequency.

According to another aspect of an example embodiment, a method of operating a receiver, includes: receiving differential signals having a variable data rate; controlling a detection signal to an activation level based on the differential signals corresponding to a first data pattern of a first frequency, wherein the first data pattern of the first frequency indicates an exit from an electrical idle state; generating sample data by sampling the differential signals at a second frequency; identifying whether the sample data indicates normal data by determining whether the sample data corresponds to a second data pattern, based on the detection signal being at the activation level; and controlling the detection signal to an inactivation level, based on a result of a comparison between the sample data and reference data. The first frequency is lower than the second frequency.

According to another aspect of an example embodiment, an interface circuit includes: a transmitter configured to transmit a first data pattern of a first frequency, which indicates an exit from an electrical idle state, transition from the electrical idle state to an electrical non-idle state, and transmit a second data pattern of a second frequency, which indicates normal data; and a receiver including: a signal detection circuit configured to generate a detection signal based on the first data pattern; an analog-digital converter circuit configured to generate sample data by sampling the second data pattern; and a control circuit configured to enable the analog-digital converter circuit, based on the detection signal, and store the sample data.

BRIEF DESCRIPTION OF DRAWINGS

The above and other aspects and features will be more apparent from the following description of example embodiments, taken in conjunction with the accompanying drawings, in which.

DETAILED DESCRIPTION

Hereinafter, various embodiments are described with reference to the accompanying drawings. Embodiments described herein are example embodiments, and thus, the present disclosure is not limited thereto, and may be realized in various other forms. Each example embodiment provided in the following description is not excluded from being associated with one or more features of another example or another embodiment also provided herein or not provided herein but consistent with the present disclosure. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
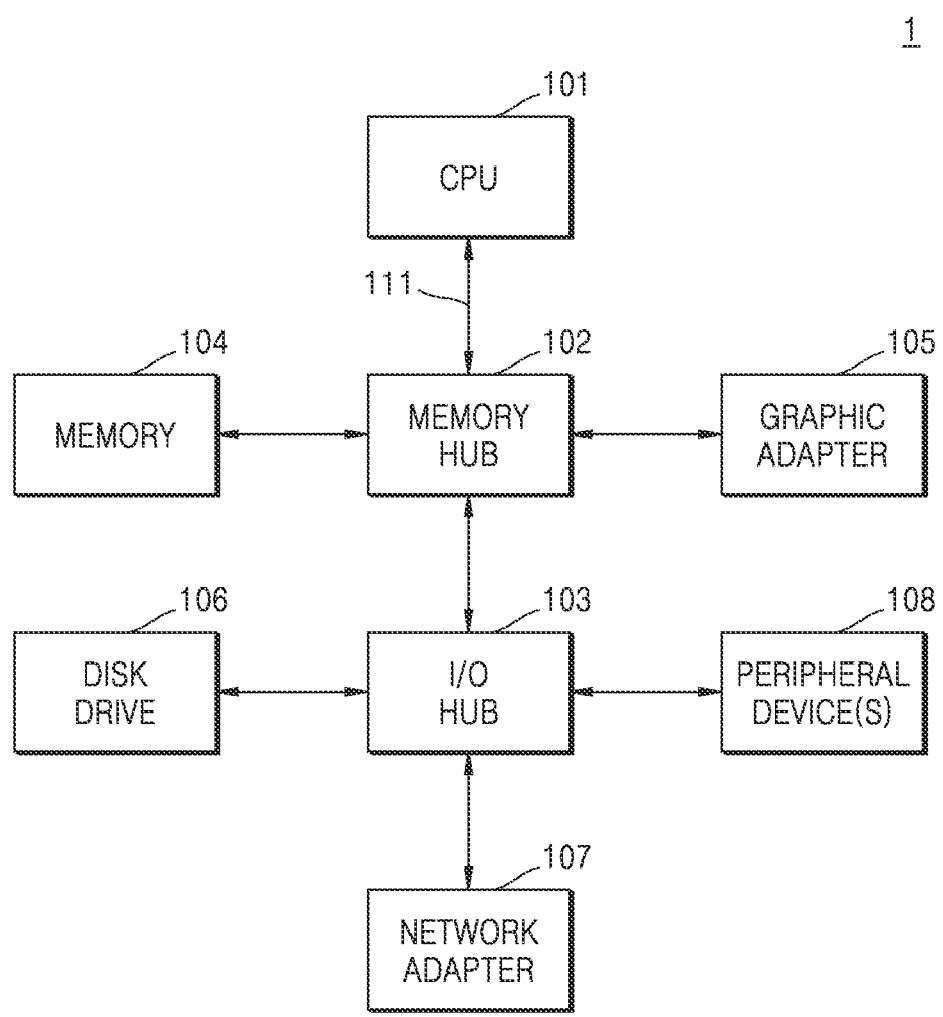
FIG. 1 is a block diagram illustrating a system according to an example embodiment.

FIG. 1 is a block diagram illustrating a system 1 according to an example embodiment.

Referring to FIG. 1, the system 1 may include a central processing unit (CPU) 101, a memory hub 102, and an input/output (I/O) hub 103. The CPU 101 may include a core, a general-purpose processor, a digital signal processor, a microprocessor, or the like configured to execute a software program.

The CPU 101 may include an arithmetic logic unit, a register, a cache memory, and the like. The CPU 101 may be connected to the memory hub 102 via a bus 111. In some example embodiments, the CPU 101 and the memory hub 102 may be integrated in a single chip or package.

The memory hub 102 may connect the CPU 101 to a memory 104 and a graphic adapter 105. The memory 104 may by a volatile memory, such as dynamic random access memory (DRAM) or static random access memory (SRAM).

The graphic adapter 105 may be connected to a processor, such as a graphics processing unit (GPU), configured to process high-capacity data.

The I/O hub 103 may provide interfaces for various devices. In some example embodiments, the I/O hub 103 may be connected to a disk drive 106, a network adapter 107, and at least one peripheral device 108. In some example embodiments, the CPU 101 and the I/O hub 103 may be integrated in a single chip or package.

The disk drive 106 may include a nonvolatile memory, such as a solid state drive (SSD) or a hard disk drive (HDD).

The network adapter 107 may be an Ethernet adapter, and the at least one peripheral device 108 may include I/O devices, such as a mouse, a keyboard, a monitor, and a speaker, as well as external storage media, such as a universal serial bus (USB) storage device.

The aforementioned components of the system 1 may be in an electrical idle state or an electrical non-idle state. In the electrical idle state, the components may operate with low power. In the electrical idle state, a level difference in differential pair signals transmitted and received among the components may be 0. In the electrical idle state, the components may operate with low power by controlling an internal clock signal not to toggle. In the electrical non-idle state, the components may perform a normal operation. In the electrical non-idle state, the level difference in differential pair signals transmitted and received among the components may be non-zero. In the electrical non-idle state, the components may control the internal clock signal to toggle. During the normal operation, the components may transmit/receive normal data.

The components may transition to the electrical idle state or the electrical non-idle state based on a series of symbols. A symbol may be represented by a packet, a message, a block, bits, or data.

A first component may exit from the electrical idle state by providing pre-defined symbols to a second component. The second component may exit from the electrical idle state by detecting the pre-defined symbols from a received pad.

The second component may include a signal detector configured to detect the pre-defined symbols. If the signal detector continuously monitors a received pad even though the second component is in the electrical non-idle state by exiting from the electrical idle state, considerable power may be consumed.

Figure 2:
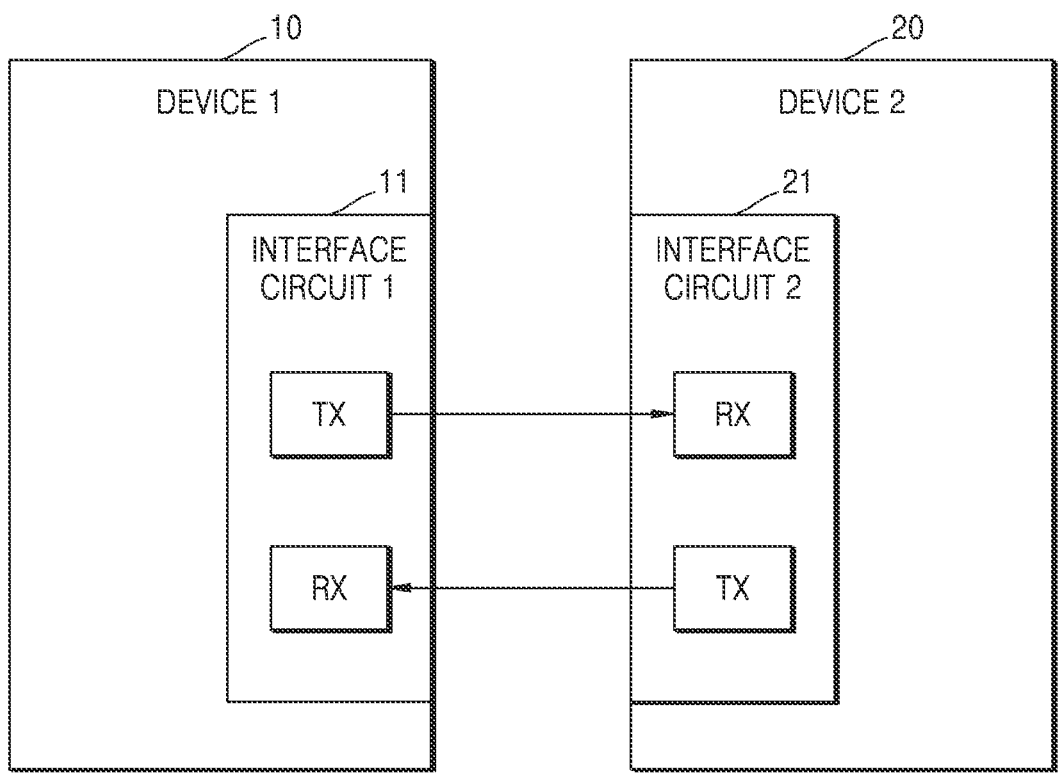
FIG. 2 is a block diagram illustrating a system according to an example embodiment.

FIG. 2 is a block diagram illustrating a system 2 according to an example embodiment.

Referring to FIG. 2, the system 2 may include a first device 10 and a second device 20. Each of the first device 10 and the second device 20 may correspond to the components included in the system 1 of FIG. 1.

The first device 10 may include a first interface circuit 11, and the second device 20 may include a second interface circuit 21. The first interface circuit 11 and the second interface circuit 21 may transmit/receive data according to protocol requirements. For example, the first interface circuit 11 and the second interface circuit 21 may communicate with each other according to a peripheral component interconnect express (PCIe) protocol. Hereinafter, it is described that the first device 10 is a transmission device, and the second device 20 is a reception device, but example embodiments are not limited thereto.

Although not shown in FIG. 2, the first device 10 may be connected to the second device 20 through a plurality of lanes. Each of the plurality of lanes may transmit/receive differential pair signals therethrough. For example, the number of lanes may be 1, 2, 4, 8, 12, 16, or 31, but example embodiments are not limited thereto. Each lane may include a transmitter (TX) configured to transmit differential pair signals and a receiver (RX) configured to receive the differential pair signals. The differential pair signals may be referred to as differential signals.

The first device 10 and the second device 20 may transmit/receive data through each lane at various data rates. For example, a data rate may be 2.5 GT/s, 5 GT/s, 8 GT/s, 16 GT/s, 32 GT/s, or 64 GT/s, but example embodiments are not limited thereto. GT/s is a unit representing gigatransfers per second and may be indicated by Gb/s. Alternatively, 1 GT/s may indicate 1 GHz. In the specification, a data rate may be referred to as a frequency.

The first device 10 and the second device 20 may establish a link including at least one lane by performing a link initialization operation.

The first device 10 and the second device 20 may transmit/receive a block, which is a pre-defined data unit, through the at least one lane included in the link. For example, a size of the block may be 130 bits, but example embodiments are not limited thereto. A structure of the block is described below with reference to FIG. 4. Based on a header (e.g., first two bits) in the block, the block may be identified as a data block or an ordered set block. The block may include a plurality of symbols. A size of a symbol may be eight bits. Therefore, in some example embodiments, one block may include one header and 16 symbols. An ordered set block may include one header and one ordered set. A data block may include one header and one data stream. The data stream may be referred to as data, a packet, a message, or the like, which the first device 10 and the second device 20 transmit/receive.

The first device 10 and the second device 20 may communicate regarding an exit from the electrical idle state by transmitting/receiving a pre-defined ordered set (i.e., an electrical idle exit ordered set (EIEOS)). The EIEOS is described below with reference to FIG. 11. Particularly, the first device 10 may exit from the electrical idle state and transmit the EIEOS to the second device 20, and the second device 20 may exit from the electrical idle state by detecting the EIEOS and receiving a pre-defined following ordered set (e.g., a skip (SKP) ordered set or a start of data stream (SDS) ordered set) after the EIEOS. The EIEOS may be transmitted using a first data rate, and the following ordered set may be transmitted using a second data rate. The first data rate may be lower than the second data rate. For example, the EIEOS may be transmitted at 600 MHz, and the following ordered set may be transmitted at 16 GHz. However, example embodiments are not limited thereto.

Figure 3:
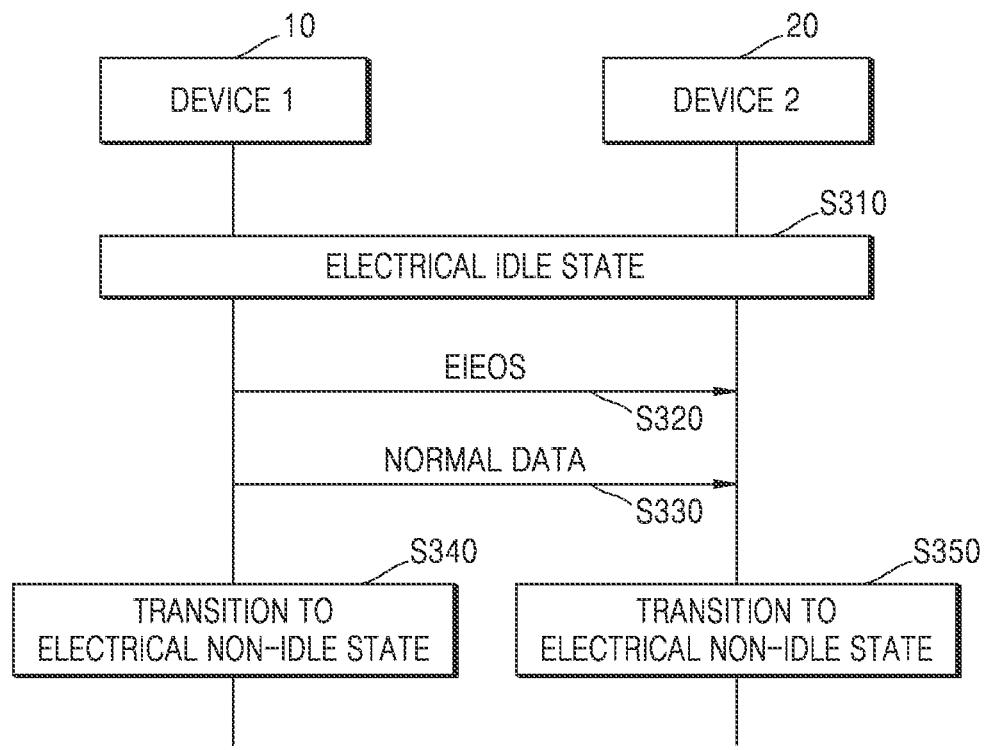
FIG. 3 is a signaling diagram illustrating an exit from an electrical idle state, according to an example embodiment.

FIG. 3 is a signaling diagram illustrating an exit from the electrical idle state, according to an example embodiment.

Referring to FIG. 3, in operation S310, the first device 10 and the second device 20 may be in the electrical idle state. The electrical idle state may indicate an L0s, L1, or L2 state according to the PCIe standard. In the electrical idle state, the first device 10 and the second device 20 may operate with low power. Therefore, at least one of components included in the first device 10 and the second device 20 may be inactivated.

In operation S320, the first device 10 may transmit an EIEOS to the second device 20. In some example embodiments, the first device 10 and the second device 20 may transmit/receive data at 32 GT/s, and two EIEOSs may be transmitted. When the first device 10 and the second device 20 transmit/receive data by using another data rate, one EIEOS may be transmitted. An EIEOS is data including consecutive 0s or 1s, and the number of consecutive 0s or 1s may vary according to a data rate between the first device 10 and the second device 20. The consecutive 0s and the consecutive 1s may be arranged alternatively. For example, if the number of each of consecutive 0s or 1s included in the EIEOS is 8 at a first data rate 4 GHz, the number of each of consecutive 0s or 1s included in the EIEOS is 16 at a second data rate 8 GHz. That is, the second device 20 may receive an EIEOS having the same frequency (e.g., 500 MHz) regardless of whether a data rate between the first device 10 and the second device 20 is the first data rate or the second data rate.

In operation S330, the first device 10 may transmit normal data to the second device 20. A pattern of the normal data may be shared in advance between the first device 10 and the second device 20. The normal data may have a higher frequency than the frequency of the EIEOS. For example, the frequency of the normal data may be 16 GHz. The normal data may include either an ordered set block or a data block.

In operation S340, the first device 10 may transition from the electrical idle state to the electrical non-idle state. In some example embodiments, the first device 10 may transition from the electrical idle state to the electrical non-idle state after transmitting the EIEOS.

In operation S350, the second device 20 may transition from the electrical idle state to the electrical non-idle state by detecting the EIEOS and identifying the normal data. The electrical non-idle state may indicate an L0 state according to the PCIe standard.

Figure 4:
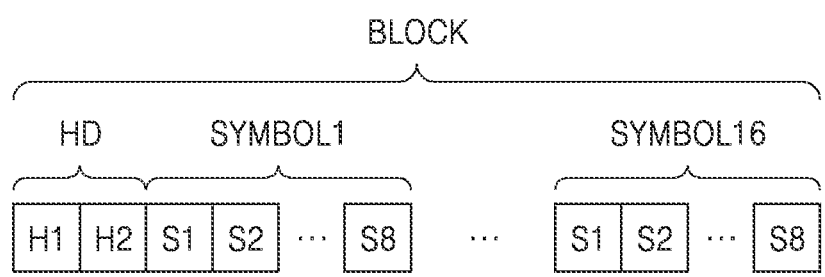
FIG. 4 illustrates a block according to an example embodiment.

FIG. 4 illustrates a block according to an example embodiment.

Referring to FIG. 4, the block may include a header HD and first to 16th symbols. However, the number of symbols is not limited thereto.

The header HD may include two bits, and each symbol may include eight bits. Therefore, a size of the block may be 130 bits. However, example embodiments are not limited thereto.

The block may be identified as an ordered set block or a data block based on the header HD. When the block is an EIEOS block, each of the first to 16th blocks may include eight consecutive 1s or 0s. For example, when a data rate is 8 GT/s, eight consecutive 1s and eight consecutive 0s may be repeated in the block. When the data rate is 16 GT/s, 16 consecutive 1s and 16 consecutive 0s may be repeated in the block. When the data rate is 32 GT/s, 32 consecutive 1s and 32 consecutive 0s may be repeated in the block. Therefore, regardless of the data rate, the second device 20 may receive an EIEOS of 500 MHz.

Figure 5:
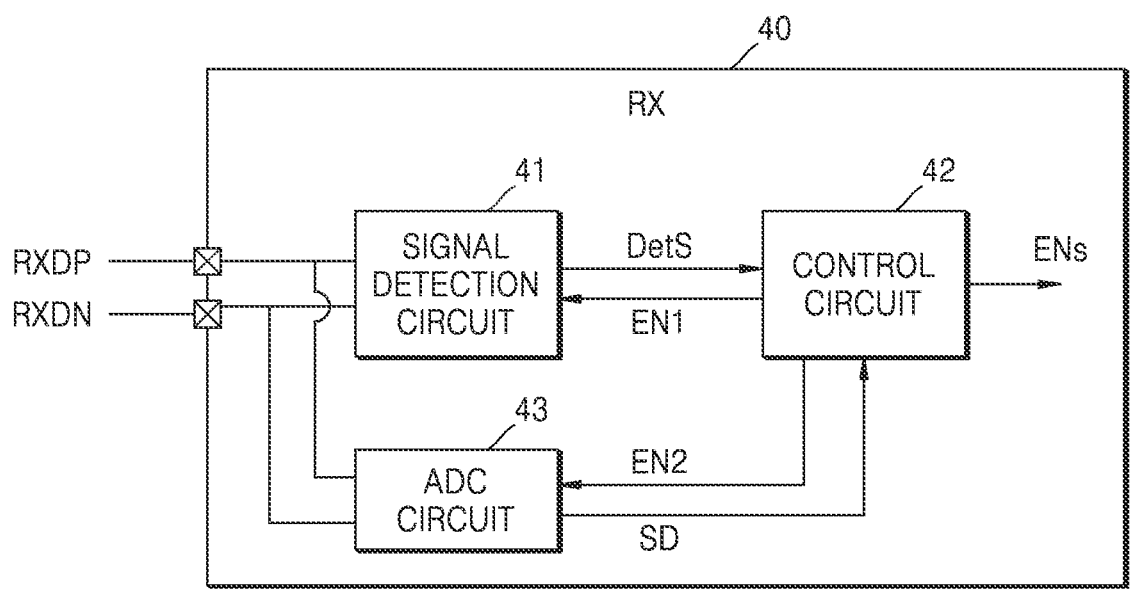
FIG. 5 is a block diagram illustrating a receiver according to an example embodiment.

FIG. 5 is a block diagram illustrating an RX 40 according to an example embodiment.

Referring to FIG. 5, the RX 40 may include a signal detection circuit 41, a control circuit 42, and an analog-digital converter (ADC) circuit 43. The RX 40 may receive differential signals RXDP and RXDN.

The signal detection circuit 41 may receive the differential signals RXDP and RXDN and detect an EIEOS of a first frequency. For example, the first frequency may be 500 MHz. The signal detection circuit 41 may provide a detection signal DetS to the control circuit 42.

The control circuit 42 may generate a second enable signal EN2 for enabling the ADC circuit 43, based on the detection signal DetS. Enabling may be referred to as activating. Disabling may be referred to as inactivating. A level of a signal for enabling a component may be referred to as an activation level, and a level of a signal for disabling a component may be referred to as an inactivation level.

The ADC circuit 43 may receive the differential signals RXDP and RXDN and identify normal data of a second frequency. The normal data may differ from the EIEOS. The second frequency may be higher than the first frequency. The ADC circuit 43 may generate sample data SD by sampling the normal data. A description of the ADC circuit 43 is described below with reference to FIGS. 6 and 7.

The control circuit 42 may compare the sample data SD to reference data to check whether accurate normal data has been received. If it is determined that accurate normal data has been received, the control circuit 42 may generate a first enable signal EN1 for disabling the signal detection circuit 41. In addition, the control circuit 42 may enable signals ENs for enabling the other components in the RX 40. If accurate normal data has been received, the RX 40 may transition from the electrical idle state to the electrical non-idle state.

According to an example embodiment, when the RX 40 exits from the electrical idle state, the signal detection circuit 41 may be disabled, thereby saving power to be consumed by the signal detection circuit 41. For example, the signal detection circuit 41 may be disabled based on the first enable signal EN1.

According to an example embodiment, the EIEOS may be primarily detected by the signal detection circuit 41, and the normal data may be secondarily sampled by the ADC circuit 43 and compared to the reference data, thereby providing an improved normal data detection performance.

Figure 6:
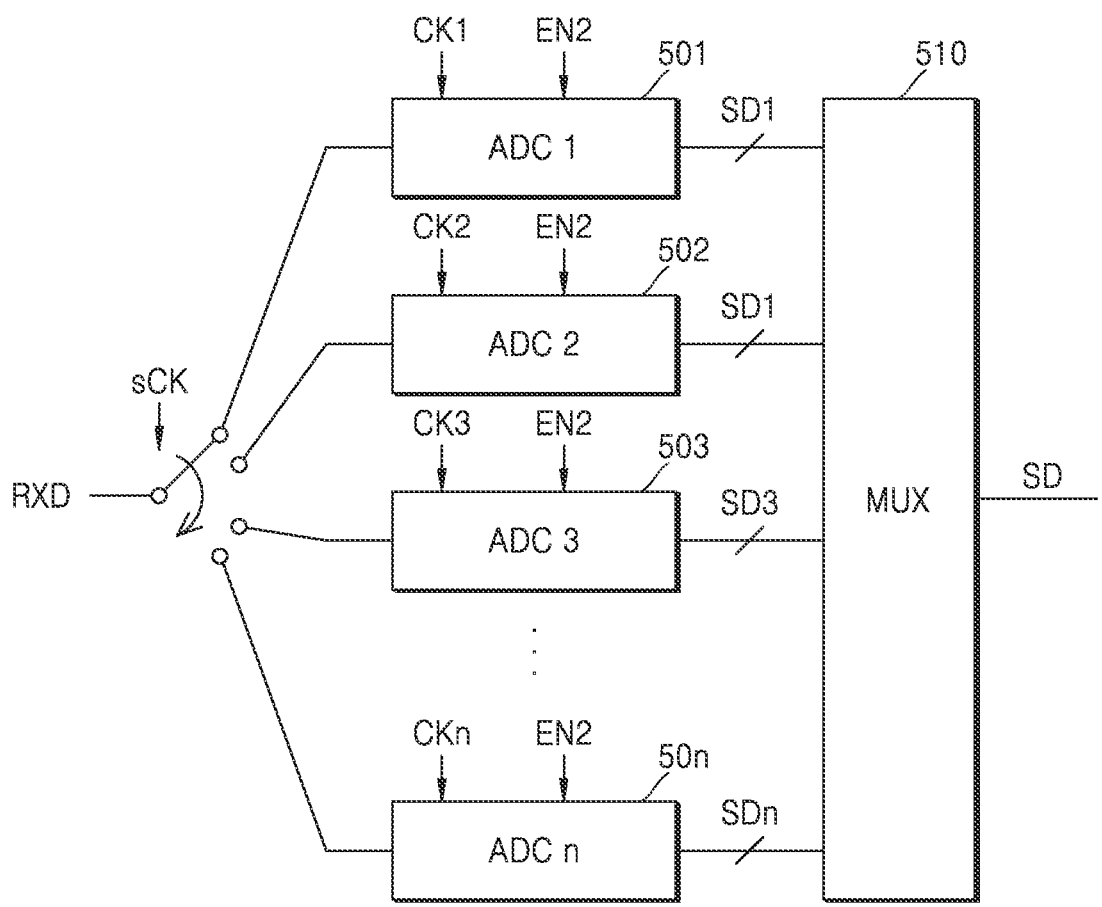
FIG. 6 is a block diagram schematically illustrating an analog-digital converter circuit controlled by a time-interleaving scheme, according to an example embodiment.

FIG. 6 is a block diagram schematically illustrating the ADC circuit 43 controlled by a time-interleaving scheme, according to an example embodiment.

Referring to FIG. 6, the ADC circuit 43 may generate the sample data SD by alternately sampling an input signal RXD, based on first to nth clock signals CK1 to CKn (n is a natural number greater than or equal to 2) having different phases. The input signal RXD may have a value corresponding to a difference between the differential signals RXDP and RXDN.

The ADC circuit 43 may include first to nth ADCs 501 to 50n and a select circuit 510 (e.g., a multiplexer).

The first to nth ADCs 501 to 50n may be sequentially selected according to a sample clock signal sCK and may output first to nth sample data SD1 to SDn by sampling the input signal RXD, based on the first to nth clock signals CK1 to CKn having different phases. For example, the first ADC

501 may output the first sample data SD1, based on the first clock signal CK1, and the second ADC 502 may output the second sample data SD2, based on the second clock signal CK2. The first sample data SD1 may include a plurality of samples obtained at an edge timing of the first clock signal CK1, and the second sample data SD2 may include a plurality of samples obtained at an edge timing of the second clock signal CK2. The first to nth clock signals CK1 to CKn may have the same frequency, e.g., a frequency corresponding to a sampling frequency fs/n. Although not shown in FIG. 5, the RX 40 may further include a clock generator configured to generate the sample clock signal sCK and the first to nth clock signals CK1 to CKn.

The select circuit 510 may output the sample data SD by alternately selecting the first to nth sample data SD1 to SDn.

The first to nth ADCs 501 to 50n may be enabled, based on the second enable signal EN2.

Figure 7:
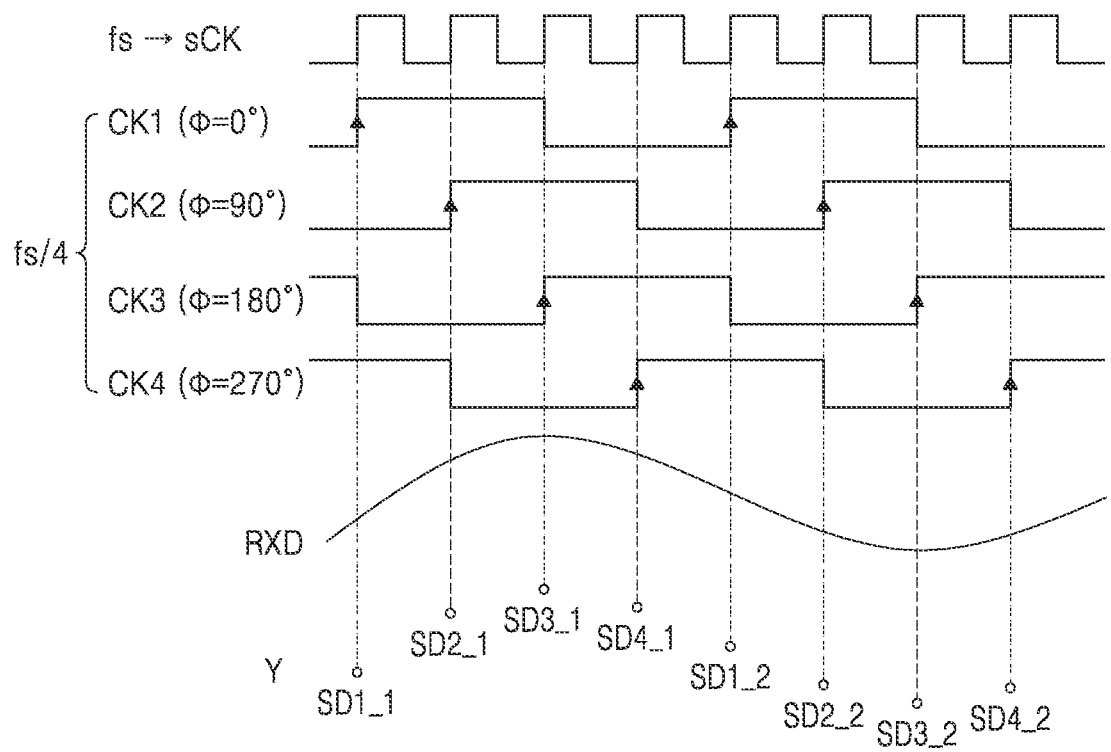
FIG. 7 is a timing diagram illustrating a time-interleaving scheme according to an example embodiment.

FIG. 7 is a timing diagram illustrating the time-interleaving scheme according to an example embodiment. Particularly, FIG. 7 illustrates a case where n is 4 in FIG. 6.

Referring to FIG. 7, the input signal RXD may be alternately sampled by the first to fourth clock signals CK1 to CK4. Frequencies of the first to fourth clock signals CK1 to CK4 may be the same as the sampling frequency fs/4, and phases of the first to fourth clock signals CK1 to CK4 may be 0°, 90°, 180°, 270°, respectively. Therefore, edge timings of the first to fourth clock signals CK1 to CK4 may be sequentially repeated. First sample data SD1_1 and SD1_2 may be obtained by the first clock signal CK1, second sample data SD2_1 and SD2_2 may be obtained by the second clock signal CK2, third sample data SD3_1 and SD3_2 may be obtained by the third clock signal CK3, and fourth sample data SD4_1 and SD4_2 may be obtained by the fourth clock signal CK4.

A frequency of each of the first to fourth clock signals CK1 to CK4 may correspond to the sampling frequency fs/4, but because the first to fourth sample data SD1_1, SD1_2, SD2_1, SD2_2, SD3_1, SD3_2, SD4_1, and SD4_2 constitute the sample data SD as an output signal, a frequency at which the input signal RXD is sampled may be a sampling frequency fs. The first to fourth sample data SD1_1, SD1_2, SD2_1, SD2_2, SD3_1, SD3_2, SD4_1, and SD4_2 may be sequentially output according to a sampled order to constitute the sample data SD.

Figure 8:
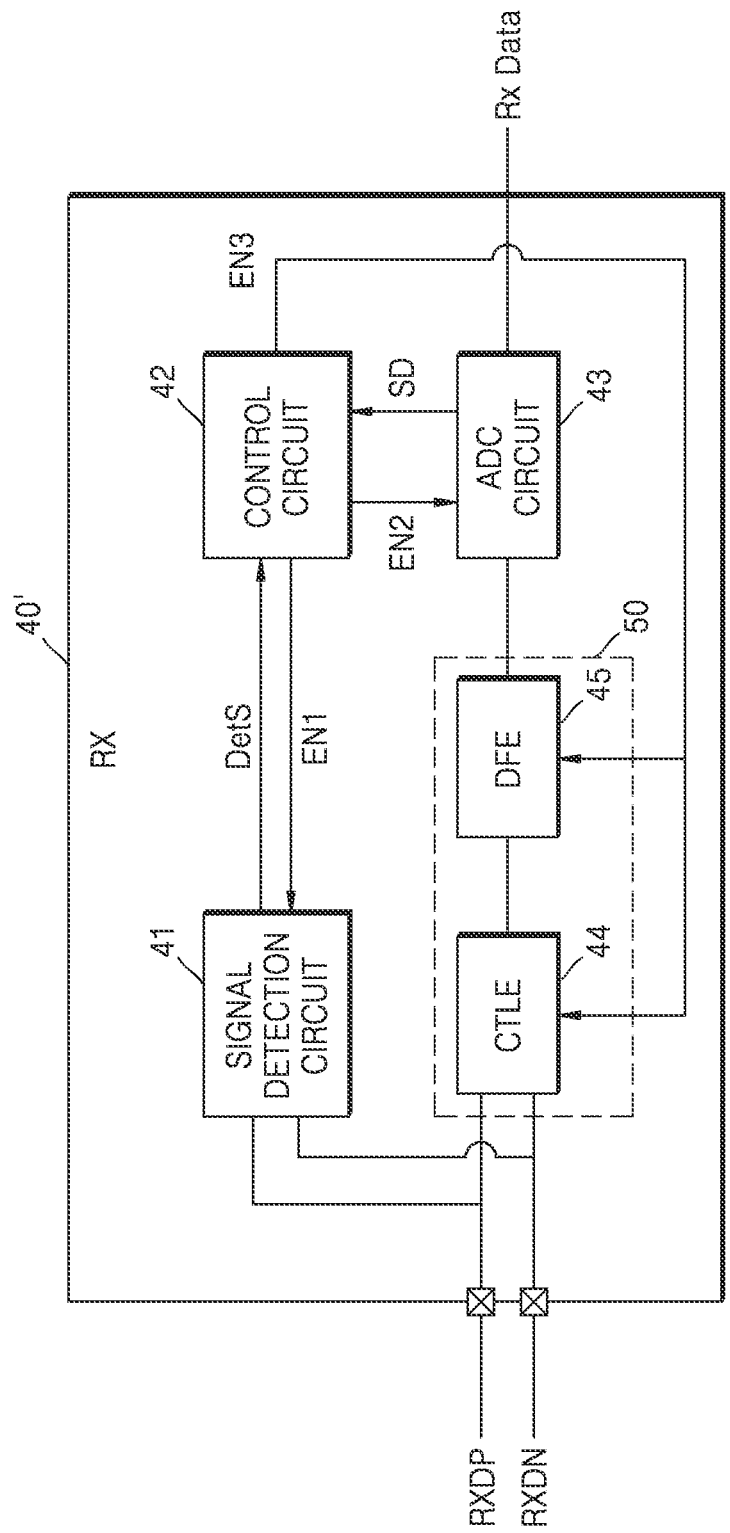
FIG. 8 is a block diagram illustrating a receiver according to an example embodiment.

FIG. 8 is a block diagram illustrating an RX 40' according to an example embodiment.

Referring to FIG. 8, unlike the RX 40 of FIG. 5, the RX 40' may further include an equalizing circuit 50.

The equalizing circuit 50 may include a continuous-time linear equalizer (CTLE) 44 and a decision feedback equalizer (DFE) 45.

The CTLE 44 may remove an unnecessary frequency component from the differential signals RXDP and RXDN. For example, from the differential signals RXDP and RXDN, a signal of a high frequency band may pass through the CTLE 44, and a signal of a low frequency band may be removed.

The DFE 45 may reduce distortion of an input signal by using a previously input signal as a feedback signal.

In the electrical idle state, the equalizing circuit 50 may be disabled, and the differential signals RXDP and RXDN may be provided to the ADC circuit 43 by bypassing the equalizing circuit 50.

In the electrical idle state, the control circuit 42 may receive sample data from the ADC circuit 43 and compare the sample data to reference data to generate a third enable signal EN3.

The CTLE 44 and the DFE 45 may be enabled, based on the third enable signal EN3.

Figure 9:
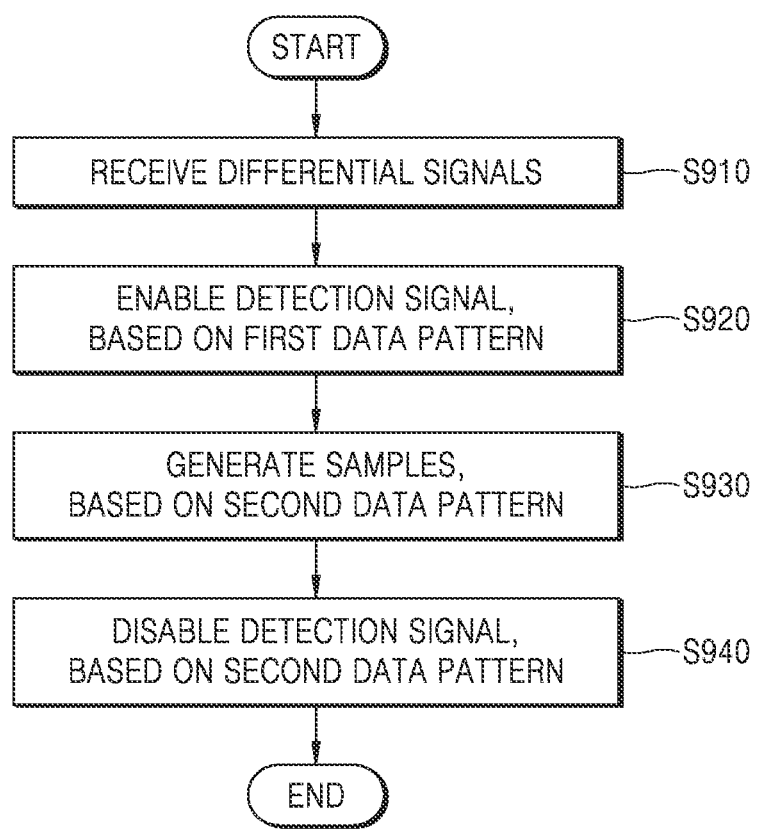
FIG. 9 is a flowchart illustrating a method of operating a receiver, according to an example embodiment.

FIG. 9 is a flowchart illustrating a method of operating an RX, according to an example embodiment. FIG. 9 is described with reference to FIG. 8.

In operation S910, in the electrical idle state, the RX 40' may receive differential signals. A data rate of the differential signals may be variable.

In operation S920, the RX 40' may enable a detection signal, based on a first data pattern indicated by the differential signals. The first data pattern may be an EIEOS and have the first frequency. Particularly, the signal detection circuit 41 may detect the EIEOS and enable the detection signal in response to the EIEOS.

In operation S930, the RX 40' may generate sample data, based on a second data pattern transmitted using the differential signals. Particularly, the ADC circuit 43 may sample the second data pattern of the second frequency. The second frequency may be higher than the first frequency.

In operation S940, the RX 40' may disable the detection signal, based on the second data pattern. Particularly, the RX 40' may compare the second data pattern to reference data and transition to the electrical non-idle state, based on a result of the comparison. When the RX 40' transitions to the electrical non-idle state, the signal detection circuit 41 may be disabled. When the signal detection circuit 41 is disabled, the detection signal output by the signal detection circuit 41 may also be disabled.

Figure 10:
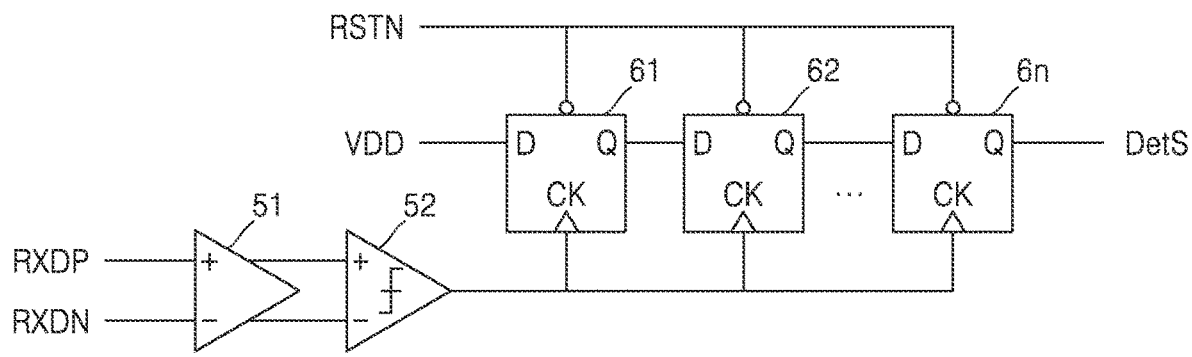
FIG. 10 is a circuit diagram illustrating a signal detection circuit according to an example embodiment.

FIG. 10 is a circuit diagram illustrating the signal detection circuit 41 according to an example embodiment.

Referring to FIG. 10, the signal detection circuit 41 may include an amplifier 51, a comparator 52, and a plurality of flip-flops, e.g., first to nth flip-flops 61 to 6n.

The amplifier 51 may receive the differential signals RXDP and RXDN and amplify each of the differential signals RXDP and RXDN.

The comparator 52 may compare a difference between the amplified differential signals to a reference level to output a level (e.g., high or low) indicated by the differential signals RXDP and RXDN.

The first to nth flip-flops 61 to 6n may use the output of the comparator 52 as a clock signal CK. Particularly, each of the first to nth flip-flops 61 to 6n may output a value of an input terminal D through an output terminal Q according to an edge timing of the clock signal CK.

The output terminal Q of each of the first to nth flip-flops 61 to 6n may be initialized to 0 in response to a reset signal RSTN. That is, an initial value of the detection signal DetS may be 0. In some example embodiments, the reset signal RSTN may be the first enable signal EN1 of FIGS. 5 and 8.

Referring to FIG. 10, at a first edge timing at which a level indicated by the differential signals RXDP and RXDN transitions from low to high, a value of the output terminal Q of the first flip-flop 61 may change to 1 by a voltage source VDD. In addition, at a second edge timing at which the level indicated by the differential signals RXDP and RXDN transitions from low to high, a value of the output terminal Q of the second flip-flop 62 may change to 1. That is, at an nth edge timing at which the level indicated by the differential signals RXDP and RXDN transitions from low to high, a value of the detection signal DetS may change to 1.

Therefore, when an nth cycle of a clock signal CK elapses, the value of the detection signal DetS may change from 0 to 1. Cycles of the clock signal CK may be determined by consecutive 1s and consecutive 0s included in an EIEOS.

Figure 11:
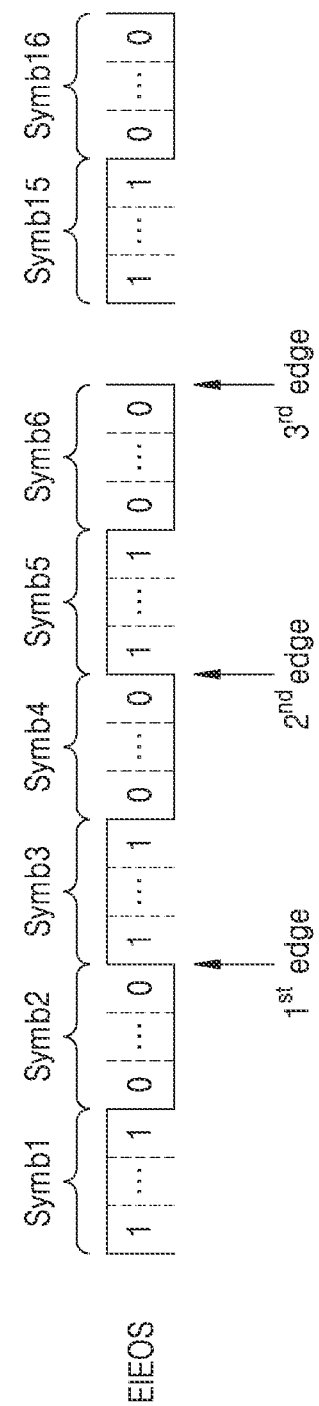
FIG. 11 illustrates an electrical idle exit ordered set (EIEOS) according to an example embodiment.

FIG. 11 illustrates an EIEOS according to an example embodiment.

Referring to FIG. 11, the EIEOS may include 16 symbols Symb1 to Symb16. Each of the 16 symbols Symb1 to Symb16 may include eight bits. Each of the 16 symbols Symb1 to Symb16 may include consecutive 1s or 0s. The EIEOS may be non-scrambled data. Normal data may be scrambled data.

Referring to FIG. 10, the first to nth flip-flops 61 to 6n may use the EIEOS of FIG. 11 as the clock signal CK. Therefore, at a first edge timing, a value of the output terminal Q of the first flip-flop 61 may change to 1, and at a second edge timing, a value of the output terminal Q of the second flip-flop 62 may change to 1. At a third edge timing, a value of the output terminal Q of the third flip-flop 63 may change to 1.

That is, if n is 3 in FIG. 10, before the EIEOS is fully received by the RX 40, the value of the detection signal DetS may transition from 0 to 1. If the clock signal cycles a number of times that corresponds to the number of flip-flops, the value of the detection signal DetS may transition from 0 to 1.

Figure 12:
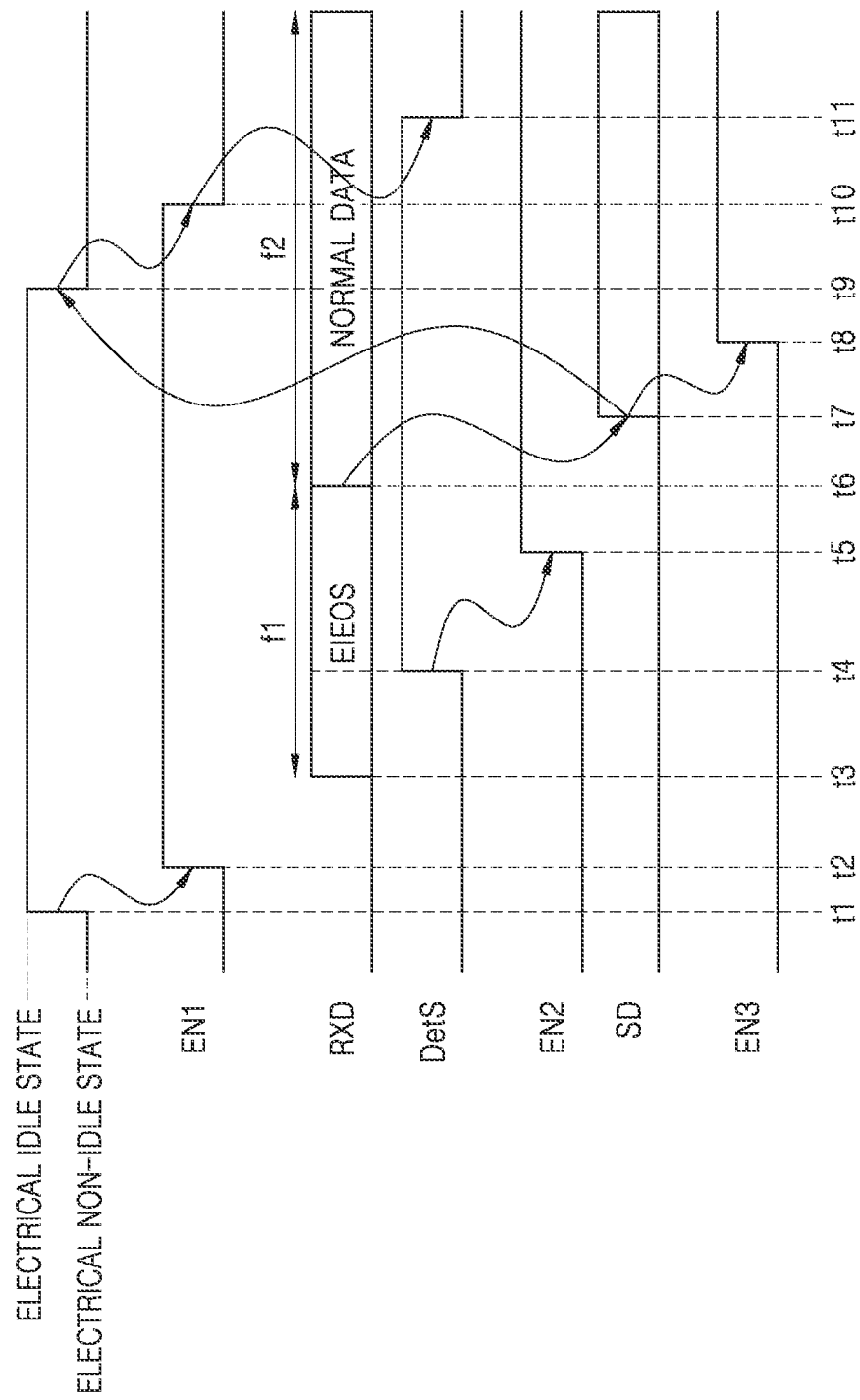
FIG. 12 is a timing diagram for a receiver according to an example embodiment.

FIG. 12 is a timing diagram for an RX according to an example embodiment. FIG. 12 is described with reference to FIG. 8.

Referring to FIG. 12, at a first time point t1, the RX 40' may transition to the electrical idle state.

At a second time point t2, the control circuit 42 may enable the signal detection circuit 41 by transitioning the first enable signal EN1 to the activation level.

From a third time point t3, an EIEOS may be received from a TX. The EIEOS may be received at a first frequency f1. The first frequency f1 may be, for example, 500 MHz.

At a fourth time point t4, the signal detection circuit 41 may determine that the EIEOS has been detected, and may transition the detection signal DetS to a high level based on detection of the EIEOS.

At a fifth time point t5, the control circuit 42 may transition the second enable signal EN2 to the activation level, based on the detection signal DetS having transitioned to the high level. Accordingly, the ADC circuit 43 may be enabled and sample the input signal RXD.

From a sixth time point t6, normal data may be received from the TX. The normal data may be received at a second frequency f2. The second frequency f2 may be higher than the first frequency f1.

At a seventh time point t7, the ADC circuit 43 may generate the sample data SD by sampling the normal data. At the seventh time point t7, the control circuit 42 may compare the sample data SD to reference data to determine whether accurate normal data has been received. The normal data may have a pre-defined pattern.

When the accurate normal data is received, at an eighth time point t8, the control circuit 42 may enable the equalizing circuit 50 by transitioning the third enable signal EN3 to the activation level.

When the accurate normal data is received, at a ninth time point t9, the RX 40' may transition to the electrical non-idle state.

At a tenth time point t10, the control circuit 42 may disable the signal detection circuit 41 by transitioning the first enable signal EN1 to the inactivation level. The signal detection circuit 41 configured to detect the EIEOS may be disabled in the electrical non-idle state to prevent power consumption. In some example embodiments, the control circuit 42 may disable the signal detection circuit 41 by transitioning the first enable signal EN1 to the inactivation level in response to the value of the detection signal DetS changing to 1. That is, the signal detection circuit 41 may be disabled at an earlier timing to save more power.

At an eleventh time point t11, the control circuit 42 may reset the signal detection circuit 41 to control the signal detection circuit 41 to change the value of the detection signal DetS to 0.

Figure 13:
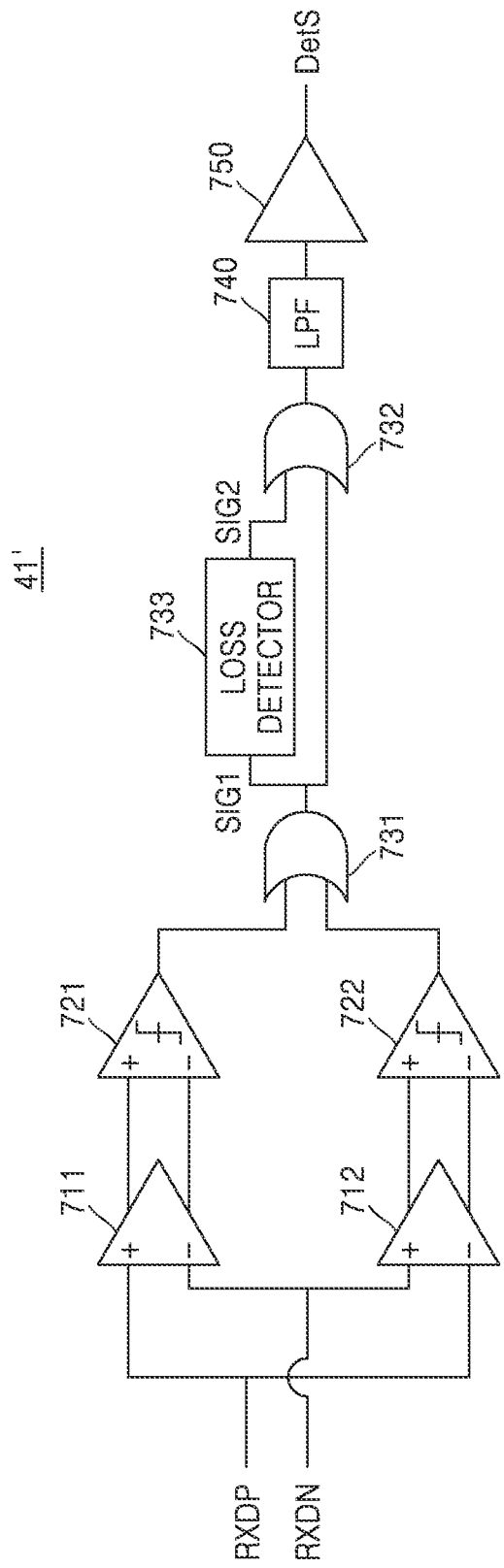
FIG. 13 is a circuit diagram illustrating a signal detection circuit according to a comparative example.

FIG. 13 is a circuit diagram illustrating a signal detection circuit 41' according to a comparative example.

The signal detection circuit 41' according to a comparative example may include first and second amplifiers 711 and 712, first and second comparators 721 and 722, first and second OR operation circuits 731 and 732, a loss detector 733, a low-pass filter 740, and a third amplifier 750.

Each of the first and second amplifiers 711 and 712 may amplify signal levels of the differential signals RXDP and RXDN. Polarities of the differential signals RXDP and RXDN received by the first and second amplifiers 711 and 712 may be opposite to each other.

Each of the first and second comparators 721 and 722 may compare an amplified signal level to a reference level to output a signal level indicated by the differential signals RXDP and RXDN.

The first OR operation circuit 731 may output a first signal SIG1 by performing an OR operation on outputs of the first and second comparators 721 and 722. That is, when the differential signals RXDP and RXDN indicate 1 or 0, the first signal SIG1 may be high. For example, when the differential signals RXDP and RXDN indicate 1, it may mean that a level of RXDP is 1 and a level of RXDN is 0. When the differential signals RXDP and RXDN indicate 0, it may mean that a level of RXDP is 0 and a level of RXDP is 1.

The loss detector 733 may detect a glitch occurring in the first signal SIG1. That is, the loss detector 733 may output a second signal SIG2 activated in a time period in which a level of the first signal SIG1 sharply changes.

The second OR operation circuit 732 may perform an OR operation on the first signal SIG1 and the second signal SIG2. Therefore, an output value of the second OR operation circuit 732 may be the first signal SIG1 from which the glitch has been corrected.

The low-pass filter 740 may cancel noise from the first signal SIG1 from which the glitch has been corrected, and the third amplifier 750 may amplify the level of the first signal SIG1, from which the noise has been cancelled, to generate the detection signal DetS.

The signal detection circuit 41' according to a comparative example includes more amplifiers and more comparators than the signal detection circuit 41 according to an example embodiment, and thus, according to an example embodiment, the highly integrated RXs 40 and 40', which may be implemented in a small area, may be provided.

While aspects of example embodiments been particularly shown and described, it will be understood that various changes in form and details may be made therein without departing from the spirit and scope of the following claims.

What is claimed is:

1. A receiver comprising:
   a signal detection circuit configured to receive differential signals having a variable data rate, and provide a detection signal based on the differential signals corresponding to a first data pattern of a first frequency, wherein the first data pattern of the first frequency indicates an exit from an electrical idle state;
   an analog-digital converter circuit configured to generate sample data by sampling the differential signals at a second frequency, and identify whether the sample data corresponds to a second data pattern which indicates normal data; and a control circuit configured to enable the analog-digital converter circuit based on the detection signal, and store the sample data, wherein the first frequency is lower than the second frequency.

2. The receiver of claim 1, wherein the control circuit is further configured to compare, in a comparison, the sample data to reference data and disable the signal detection circuit based on a result of the comparison.

3. The receiver of claim 2, further comprising an equalizing circuit configured to perform an equalizing operation on the differential signals, wherein the control circuit is further configured to enable the equalizing circuit, based on the result of the comparison.

4. The receiver of claim 1, wherein the control circuit is further configured to disable the signal detection circuit, based on the detection signal.

5. The receiver of claim 1, wherein the signal detection circuit comprises:

an amplifier configured to output an amplification signal based on the first data pattern;

a comparator configured to compare the amplification signal to a reference level and output a comparison signal; and a plurality of flip-flops configured to receive the comparison signal as a clock, and activate the detection signal based on the comparison signal indicating a pre-defined clock cycle.

6. The receiver of claim 5, wherein the control circuit is further configured to compare, in a comparison, the sample data to reference data, and control the detection signal to an inactivation level by resetting the plurality of flip-flops based on a result of the comparison.

7. The receiver of claim 1, wherein the analog-digital converter circuit comprises:

a plurality of analog-digital converters configured to output samples for the second data pattern, based on a plurality of clock signals having different phases; and a select circuit configured to generate the sample data by serializing the samples output from the plurality of analog-digital converters.

8. The receiver of claim 1, wherein the signal detection circuit is further configured to provide the detection signal before the first data pattern ends.

9. The receiver of claim 1, wherein the control circuit is further configured to compare, in a comparison, the sample data to reference data and exit from the electrical idle state based on a result of the comparison.

10. The receiver of claim 1, wherein the signal detection circuit is further configured to identify the first data pattern based on one of the differential signals.

11. A method of operating a receiver, the method comprising:

receiving differential signals having a variable data rate;

controlling a detection signal to an activation level based on the differential signals corresponding to a first data pattern of a first frequency, wherein the first data pattern of the first frequency indicates an exit from an electrical idle state;

generating sample data by sampling the differential signals at a second frequency;

identifying whether the sample data indicates normal data by determining whether the sample data corresponds to a second data pattern, based on the detection signal being at the activation level; and controlling the detection signal to an inactivation level, based on a result of a comparison between the sample data and reference data, wherein the first frequency is lower than the second frequency.

12. The method of claim 11, further comprising enabling an equalizing operation on the differential signals, based on the result of the comparison between the sample data and the reference data.

13. The method of claim 11, wherein the controlling the detection signal to the activation level comprises controlling the detection signal to the activation level before the first data pattern ends.

14. The method of claim 11, further comprising controlling the receiver to transition from the electrical idle state to an electrical non-idle state, based on the result of the comparison between the sample data and the reference data.

15. The method of claim 11, wherein the generating of the sample data comprises:

sampling the differential signals based on a plurality of clock signals having different phases; and generating the sample data by serializing samples of the differential signals.

16. An interface circuit comprising:

a transmitter configured to transmit a first data pattern of a first frequency, which indicates an exit from an electrical idle state, transition from the electrical idle state to an electrical non-idle state, and transmit a second data pattern of a second frequency, which indicates normal data; and a receiver comprising:

a signal detection circuit configured to generate a detection signal based on the first data pattern;

an analog-digital converter circuit configured to generate sample data by sampling the second data pattern; and a control circuit configured to enable the analog-digital converter circuit, based on the detection signal, and store the sample data.

17. The interface circuit of claim 16, wherein the first frequency is lower than the second frequency.

18. The interface circuit of claim 16, wherein the control circuit is further configured to disable the signal detection circuit, based on a result of a comparison between the sample data and reference data.

19. The interface circuit of claim 18, wherein the receiver further comprises an equalizing circuit configured to perform an equalizing operation on the second data pattern, and wherein the control circuit is further configured to enable the equalizing circuit, based on the result of the comparison.

20. The interface circuit of claim 16, wherein the signal detection circuit comprises:

an amplifier configured to output an amplification signal based on the first data pattern;

a comparator configured to compare the amplification signal to a reference level and output a comparison signal; and a plurality of flip-flops configured to receive the comparison signal as a clock, and control the detection signal to an activation level based on the comparison signal indicating a pre-defined clock cycle.

* * * * *